(12) United States Patent
Guiver

(10) Patent No.: US 7,723,649 B2
(45) Date of Patent: May 25, 2010

(54) VACUUM THERMAL ANNEALER

(75) Inventor: Harold Chris Guiver, Scotts Valley, CA (US)

(73) Assignee: Steed Technology, Inc., Scotts Valley, CA (US)

( * ) Notice: Subject to any disclaimer, the term of this patent is extended or adjusted under 35 U.S.C. 154(b) by 470 days.

(21) Appl. No.: 11/687,445

(22) Filed: Mar. 16, 2007

(65) Prior Publication Data
US 2007/0251935 A1 Nov. 1, 2007

Related U.S. Application Data

(63) Continuation of application No. 10/212,898, filed on Aug. 5, 2002, now Pat. No. 7,256,370.

(51) Int. Cl.
*F27B 5/14* (2006.01)
*C23C 16/00* (2006.01)

(52) U.S. Cl. ............... 219/390; 219/405; 219/411; 118/724; 118/725; 118/50.1; 118/728; 118/729; 392/416; 392/418

(58) Field of Classification Search ............. 219/390, 219/405, 411; 118/724, 725, 50.1, 728–30; 392/416, 418
See application file for complete search history.

(56) References Cited

U.S. PATENT DOCUMENTS 6,454,863 B1 * 9/2002 Halpin ............... 118/725

* cited by examiner

*Primary Examiner*—Shawntina Fuqua
(74) *Attorney, Agent, or Firm*—Schneck & Schneck; Thomas Schneck; David M. Schneck

(57) ABSTRACT

A vacuum thermal annealing device is provided having temperature control for use with various materials, such as semiconductor substrates. A vacuum is used to remove air and outgas residual materials. Heated gas is injected planar to a substrate as pressure is quickly raised.

Concurrent with the heated gas flow, a chamber wall heater is turned on and maintains a temperature for a proper annealing time. Upon completion of the annealing process, the chamber wall heater shuts down and air is forced around the chamber wall heater. Additionally, cool gas replaces the heated gas to cool the substrate.

4 Claims, 14 Drawing Sheets

VACUUM THERMAL ANNEALER

CROSS-REFERENCE TO RELATED APPLICATION

This application is a continuation of U.S. patent application Ser. No. 10/212,898, filed Aug. 5, 2002.

TECHNICAL FIELD

The present invention relates generally to furnaces, and more particularly to a vacuum thermal furnace used in a manufacturing process to anneal semiconductor devices.

BACKGROUND

Semiconductor device manufacturing has evolved into a delicate and sophisticated process requiring state of the art processing equipment, sophisticated clean room facilities and precise and accurate metrology equipment. Semiconductor devices are typically manufactured by successively depositing and patterning layer after layer of ultra-pure materials on a substrate. These layered materials are often as pure as one part per million and are often deposited with thicknesses as precise as a few Angstroms. The deposition process is usually performed according to by some well understood process such as physical vapor deposition (PVD), chemical vapor deposition (CVD), ion beam deposition (IBD), plating, etc. Semiconductor devices are built up by depositing these thin films onto substrates made of an elemental semiconductor (e.g., silicon or germanium) or compound (e.g., gallium-arsenide or indium-phosphide) semiconductor, patterning the films using photolithography and etching processes, and then repeating the same processes using different materials and patterns. In addition to thin film deposition and photolithography processes, there are other processing steps such as annealing, burning-in, and electrical testing, which are required to make semiconductor devices. Modern processing techniques in most of these areas have been developed to manufacture semiconductor devices with dimensions so small that an instrument, such as an atomic force microscope, is required to observe the different details of millions of devices on the substrate. The degree of difficulty in manufacturing semiconductor devices has significantly increased over the years because of both this miniaturization and increased complexity of semiconductor devices.

For example, in modern manufacturing environments, allowable levels of contaminating particulates in process equipment and clean rooms are often less than one particle per cubic foot, compared to several hundred particles per cubic foot few years ago. Process gas purity of five-nines (i.e., 99.999%) or better is now required to run most processes, as compared with three-nines (i.e., 99.9%) purity in the past. Further, thin film thicknesses are often controlled to within a few Angstroms across the entire substrate, as opposed to a few nanometers. Additionally, processing windows have become extremely narrow, requiring $C_{pk}$ values (statistical process capability indices) of four sigma or better. In order to achieve these stringent manufacturing requirements, semiconductor-processing equipment has become more sophisticated. One process area, which has been forced to adapt to these new high levels of performance, is the annealing process. Requirements on temperature control and uniformity across the substrate, reduction in particulates on the substrate, reduction in gas contamination, and improved cleanliness has imposed more stringent requirements for furnace performance and design.

Annealing processes have a direct affect on the texture of a copper or other metal-film layer such as grain of the layer are controlled by the annealing process, and are critical to the electrical performance of the metal-film layer. This is especially so in microcircuits with very small line-widths that include deep and narrow trenches.

In addition, advancements in the development of copper interconnects has brought about the inclusion of other metals such as bismuth and magnesium as composites within the copper thin film. This requires additional thermal annealing treatments or alloying for homogenizing the composites, electrically activating the composites, and to provide contacts to other layers within the microcircuit.

Annealing processes are typically performed by furnaces such as a Rapid Thermal Processor (RTP) 100 displayed in FIG. 1. Typically, the RTP 100 includes a process chamber 110, a substrate stage 120, a heating lamp assembly 130, a process chamber door 140, and a motor shaft assembly 150. The RTP 100 radiantly heats wafers or other substrates in a vacuum environment. Once a substrate is loaded into the RTP 100 process chamber 110, the process chamber 110 is evacuated with a vacuum pump (not shown) and the heating lamp assembly 130 is powered on. Disadvantageously, substrates heat up very quickly and temperature is difficult to control, especially at lower temperatures. Furthermore, temperature uniformity across a substrate is difficult to control because different lamps radiate with different intensities. In fact, non-uniform heating becomes a larger problem as lamps degrade and intensity differences between lamps increase. If a lamp burns out, the heating uniformity across the substrate becomes unacceptable for proper processing to occur.

In addition to non-uniform heating problems, conventional furnaces have proven to be inadequate for annealing newer materials used in semiconductor devices such as copper, titanium, and tantalum. Although new techniques for this film deposition have been developed which make, for example, copper thin film deposition feasible, there has been little advancement in other processes, such as the annealing process. As a result, the transition from aluminum conductors to copper conductors has been very slow.

Since copper is more difficult to process than aluminum, there are many problems that must be overcome before copper conductors completely replace aluminum conductors. Some of the problems associated with using copper include difficulty in producing fine copper patterns found in integrated circuits, difficulty in polishing and planarizing a copper coated substrate, copper migration, and copper contamination. Annealing conditions directly contribute to all of these problems because copper is extremely sensitive to high temperatures, and as a result, needs to be annealed at a relatively low temperature (100° C. to 400° C.). These low temperature annealing conditions make the RTP 100 as well as other semiconductor furnaces unsuitable for processing advanced materials.

Although the RTP 100 or diffusion furnaces have conventionally been used to anneal copper, these furnaces are incapable of properly annealing the copper at a controlled low temperature. One disadvantage of conventional diffusion furnaces is that temperatures ramp up and down slowly, thus requiring an extended period of time for the annealing process. Another disadvantage of conventional diffusion furnaces is non-uniform heating of substrates from a substrate center to an outer edge (this non-uniform heating is referred to as "RTD" or Radial Thermal Delta). This non-uniform heating causes the copper on the outer edge of the substrate to anneal more quickly than the center (assuming a higher temperature on the edges relative to the center), creating poor uniformity across the substrate.

Although the RTP 100 heats rapidly, unlike the diffusion furnace, the RTP 100 also has disadvantages. The RTP 100 heats substrates rapidly to elevated temperatures by activating heat lamps, which have a tendency to heat very rapidly. These heat lamps are ineffective at low temperatures. Further, the RTP 100 lacks the capability of temperature control, which is required for proper copper annealing.

Hotplates may also be used for quick annealing associated with the chemical mechanical planarization (CMP) process used in copper electroplating. This type of annealing system fits into the mechanical schemes of the electroplating systems. A substrate is set on the hotplate where it is annealed. Certain hotplate systems isolate the substrate from the plate with a blanket of inert gas. Hotplates, however, can produce "hot spots" on the substrate, which can produce a non-uniform anneal that can cause hillock peaks that make the planarization process less effective.

Accordingly, there is a need for a vacuum thermal annealer. There is a more specific need for a thermal annealer with proper temperature control for use with high conductivity materials such as copper.

SUMMARY OF THE INVENTION

The present system and method provides a vacuum thermal annealing device for use with various materials. The device includes a process chamber for holding wafers or other substrates to be annealed, a heating system, a pumping system, a gas distribution system, and a control station. Initially, wafers or other substrates are loaded into the process chamber of the annealing device. The process chamber is then sealed. Subsequently, a vacuum is drawn on the process chamber to remove air and outgas residual materials. Next, heated gas, which may be inert, forming gas, or hydrogen is injected by special injectors such that the gas flows planar to the surface of the substrate. The heated gas is provided to the process chamber by the gas distribution system. The heated gas quickly applies heat uniformly across the substrate. The pressure in the process chamber is then quickly raised, preferably to approximately 69 kPa (about 10 psia). An exhaust pressure controller maintains the pressure in the chamber. Concurrent with the heated gas flow, at least one heater mantle turns on. Once the heater mantle reaches a desired stable temperature, the heated gas flow is reduced and heat from the heater mantle maintains a temperature for the proper annealing time. A wafer or substrate mantle may also be employed in such a way that adjacent substrate mantles are capable of concurrently heating both sides of the substrate located between the adjacent substrate mantles.

Once the annealing process is completed, the heater mantle shuts down. Simultaneously, inert gas, forming gas, or hydrogen gas is forced around the heater mantle and exhausted out of the process chamber. At least one injected inert gas or reducing gas cool both the chamber heater mantle and the substrates quickly. The heated gas is also shut off and cooled gas immediately flows through the special injectors to cool the substrates. The cooled gas, as with the heated gas, flows planar to the substrate for effective sweeping of the substrate. When the substrate temperature is lowered to an appropriate level, the process chamber may be opened, and the substrates removed.

DETAILED DESCRIPTION OF THE INVENTION

Figure 1:
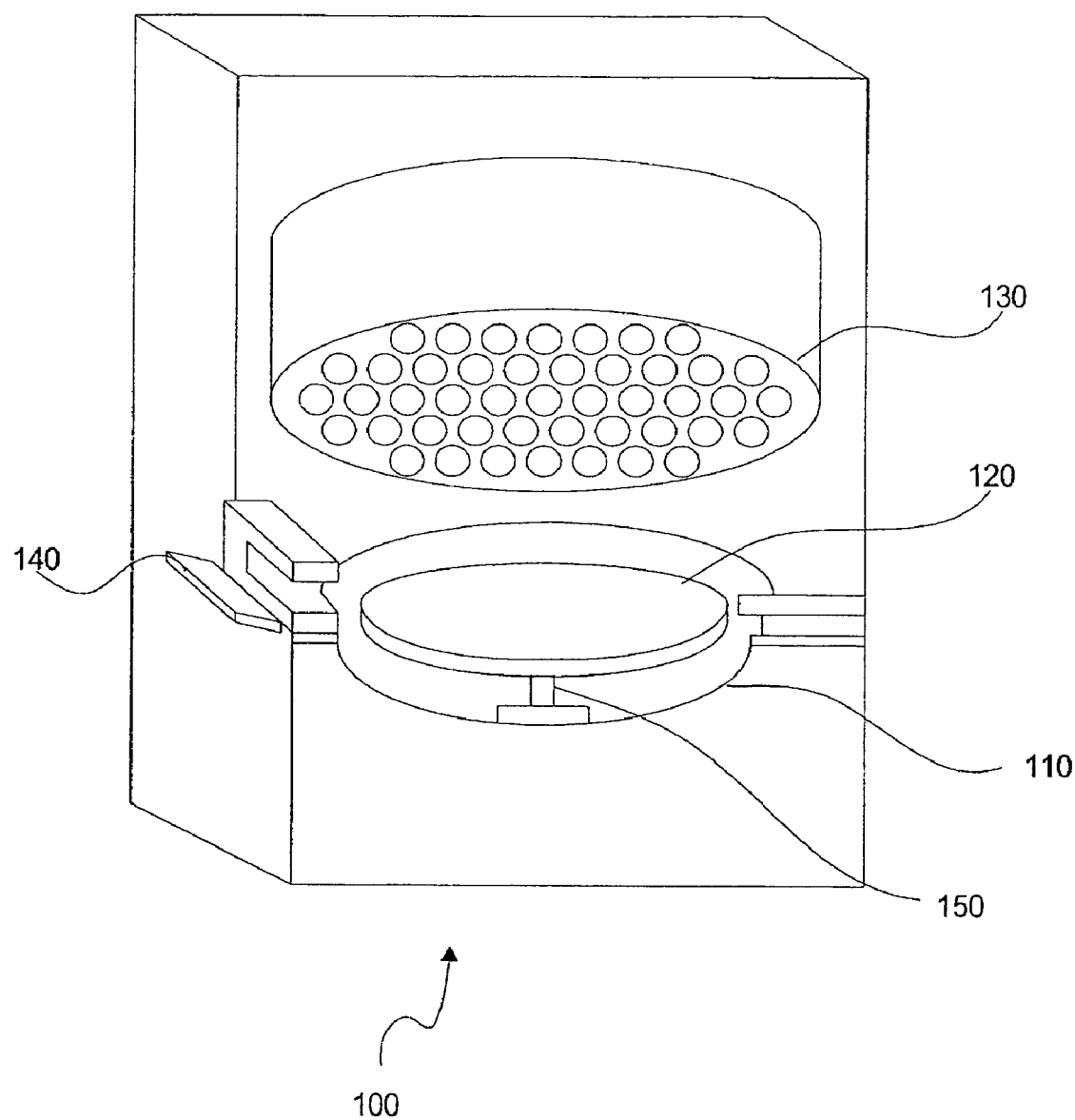
FIG. 1 is a prior art diagram showing a rapid thermal processor furnace.
Figure 2:
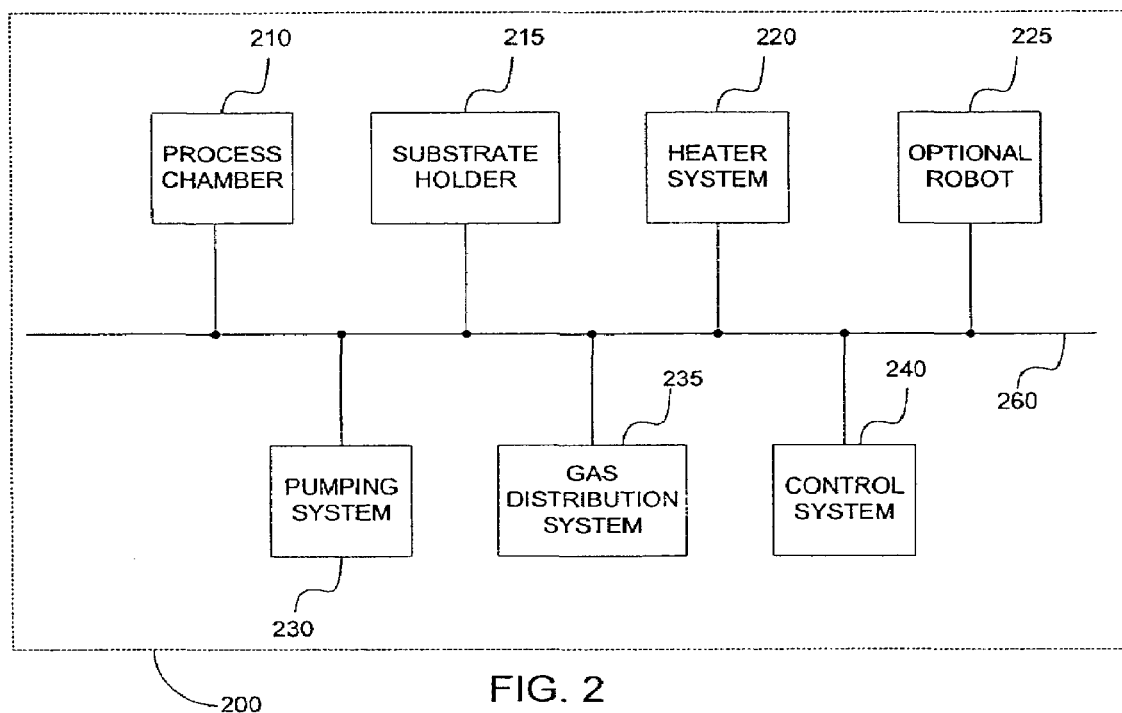
FIG. 2 is a block diagram of components of an exemplary vacuum thermal annealing furnace, according to the present invention.

FIG. 2 is a block diagram showing components of an exemplary vacuum thermal annealing furnace 200. The vacuum thermal annealing furnace 200 includes a process chamber 210, a substrate holder 215, a heater system 220, an optional robot 225, a pumping system 230, a gas distribution system 235, a control system 240, and a bus 260 which couples all of these components together. The control system 240 is hardware and/or software-based, which is coupled to some or all the other components in the vacuum thermal annealer 200. The substrate holder 215 (also referred to as a substrate mantle) is used to hold wafers or other substrates during an annealing process, and is constructed from materials with favorable heat transfer properties, such as aluminum or zirconia. Additionally, the substrate holder 215 can be interchanged with a substrate holder made of different materials in order to satisfy needs of a particular annealing application.

The control system 240 provides a central point from where other components can be configured and controlled. For example, the control system 240 allows a user to write recipes that include different processing conditions. Software of the control system 240 will then carry out the steps of the recipe. A typical recipe may include temperature ramp-up rate, temperature set-point, dwell time, ramp-down rate, and gas type for activation at each step. The control system 240 typically consists of a computing device with a graphical user interface (GUI), specially written software coupled to other more specialized hardware, and software such as dedicated temperature controllers. Temperature control algorithms, such as Proportional-Integral-Derivative (PID) algorithms, are included in the control system 240, and are used to set and control a process temperature.

Figure 3:
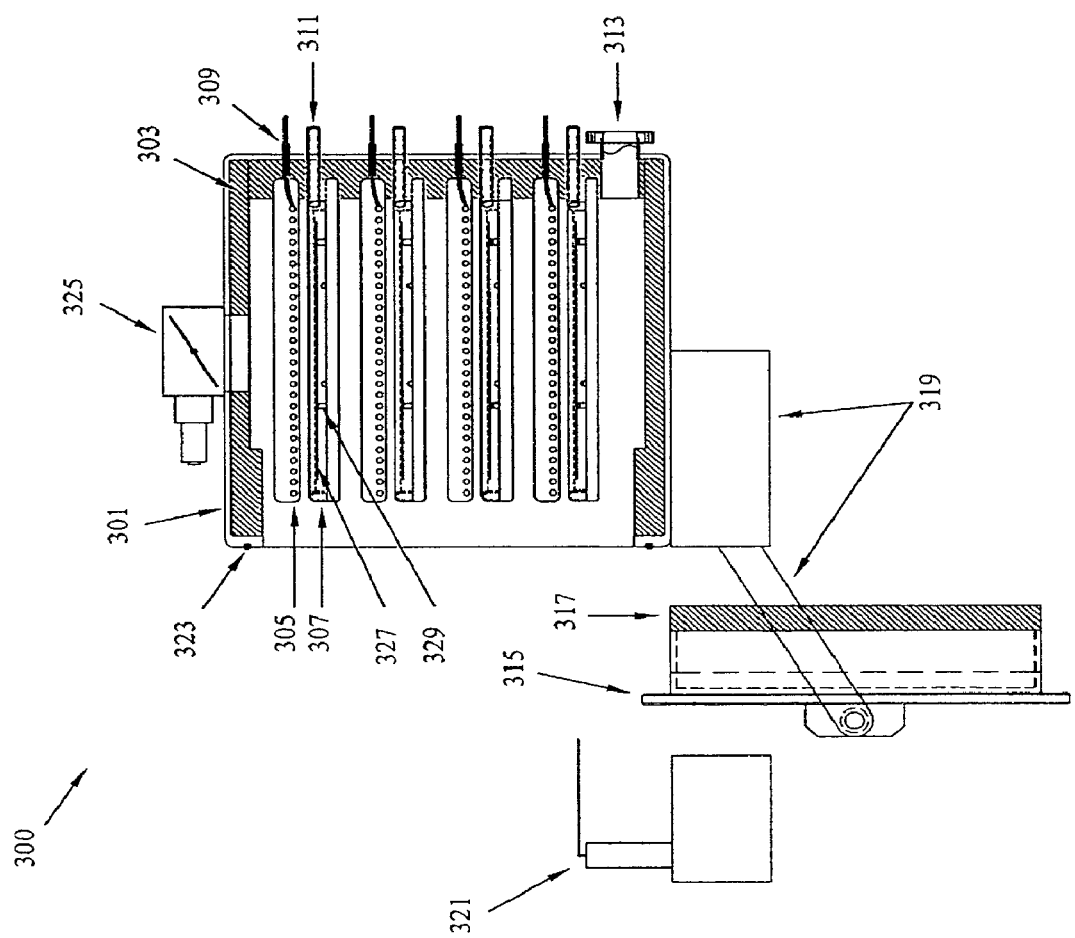
FIG. 3 is a diagram illustrating an embodiment of the vacuum thermal annealing system in a standby position ready to be loaded.

FIG. 3 is a diagram showing components of an exemplary vacuum thermal annealing system 300 in a standby mode (i.e., ready-to-be-loaded position). The vacuum thermal annealing system 300 includes a process chamber 301, a chamber liner 303, a heater system 305, a substrate holder 307, an electrical feed-through 309, an injector system 311, a vacuum connecting port 313, a chamber door 315, a chamber door liner 317, a chamber door actuator 319, and an optional robot 321. The vacuum connecting port 313 is a conventional pumping port used to pump gases and vapors out of the process chamber 301. A gas distribution manifold (to be discussed in detail in connection with FIG. 4) is a piping system designed to deliver gas uniformly to one or more substrates 327. Preferably, a programmable exhaust valve 325 is used to control an exhaust pressure within the process chamber 301.

As shown, the chamber door 315 is lowered from the process chamber 301 to allow the optional robot 321 to load one or more substrates 317 onto the substrate holder 307. The one or more substrates 327 are then moved into a concentric position on one or more of the substrate holders 307. In the present embodiment, the one or more substrates 327 are first loaded onto the substrate holder 307 by the optional robot 321. Alternatively, since the optional robot 321 is not required, an operator can manually load the one or more substrates 317. Although the optional robot 321 is not essential, the optional robot 321 is preferable because robot handling of substrates reduces handling damage, reduces contamination, and improves consistency—resulting in better yields and better process control.

Once the one or more substrates 327 are loaded, the chamber door 315 is then raised by the chamber door actuator 319, and placed into position to seal the process chamber 301 with one or more o-rings 323 creating a vacuum seal. The chamber door actuator 319, which moves the chamber door 315 into a proper opened or closed position, may include a torque control device. This torque control device is used to force the chamber door 315 closed when a pressure in the process chamber 301 is elevated above atmospheric pressure. A positive door closure assures the chamber door 315 does not open when hazardous gases are used within the process chamber 301. The set of o-rings 323 between the process chamber 301 and the chamber door 315 form a vacuum seal allowing the process chamber 301 to be pumped down to low pressures as will be described in more detail in connection with FIG. 4. The set of o-rings 323 can be made of materials, such as high temperature sealing elastomer, depending on the particular application of the vacuum thermal annealing furnace 300.

The heater system 305 is an electrical heating system which typically works by resistive or inductive heating, and is used primarily to heat the substrate below the heater system 305, and secondarily to heat the process chamber walls and mantles. The incoming gas is superheated as will be discussed in conjunction with FIG. 8.

Figure 4:
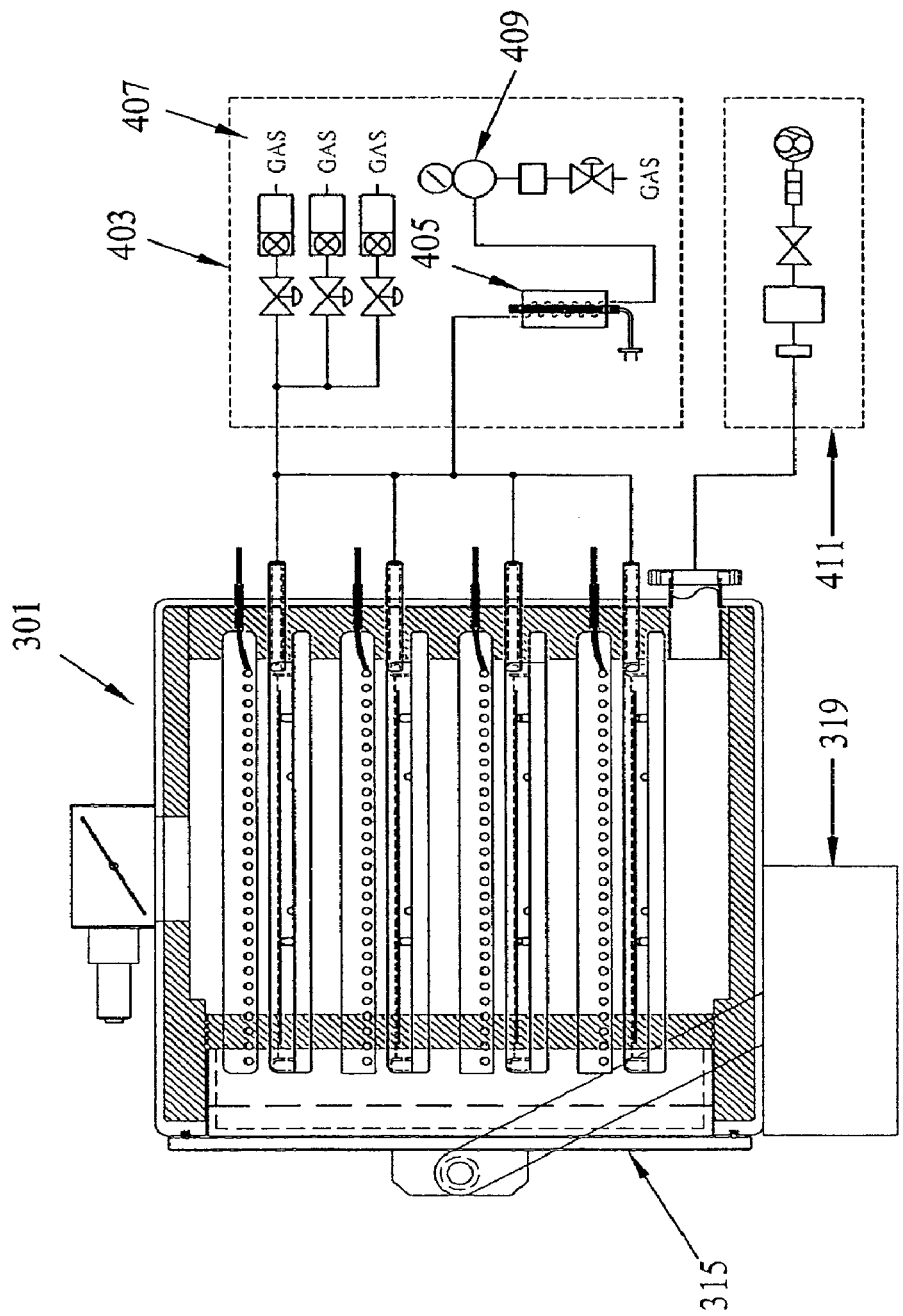
FIG. 4 is a diagram of components of an exemplary vacuum thermal annealing system in a processing position, according to the present invention.

FIG. 4 is an exemplary block diagram of the vacuum thermal annealing system 300 illustrating a process chamber 301 interfaced to a gas distribution system 403 and a vacuum pumping system 411. In the embodiment of FIG. 4, the vacuum thermal annealing system 300 is in a process mode (i.e., where the substrates are ready to be annealed). The vacuum thermal annealing system 300 is typically interfaced to a controller (not shown). The process chamber 301 may be a metal chamber, which is typically constructed out of stainless steel or aluminum. The process chamber 301 further includes doors, ports, wire feed-throughs, plumbing connections as well as other equipment connections and vacuum seals (not shown). An interior of the process chamber 301 can also be lined with the line 303 usually made out of a metal or ceramic such as zirconia.

The set of o-rings 323 between the chamber 301 and the chamber door 315 form a vacuum seal allowing the process chamber 301 to be pumped down to low pressures with the pumping system 411. When the pumping system 411 is turned on, air, moisture, and outgassed residual materials in the process chamber 301 are evacuated through the vacuum connection port 313, which is used to attach the process chamber 301 to the pumping system 411. The vacuum connecting port 313 is typically made out of stainless steel, but can be made of other materials including aluminum. Further, the vacuum connecting port 313 between the process chamber 301 and the pumping system 411 is usually accomplished through a standard vacuum connection such as an ISO K-100 or KF-40 as defined in standard vacuum books.

The pumping system 411 typically includes a set of pumps and pressure gauges. The set of pumps usually comprises one or more mechanical pumps, dry-vacuum pumps, turbo-molecular pumps, or cryogenic pumps depending on a base pressure desired and type of process gas being used. Similarly, the set of pressure gauges usually includes one or more convection gauges, capacitance manometers, or ion gauges, depending on the pressure being measured. Finally, the gas distribution system 403 is a piping system, which delivers gas into the process chamber 301 in a manner that uniformly and rapidly heats substrates loaded in the substrate holder 307, and further rapidly cools the process chamber 301 after the annealing process.

Figure 5:
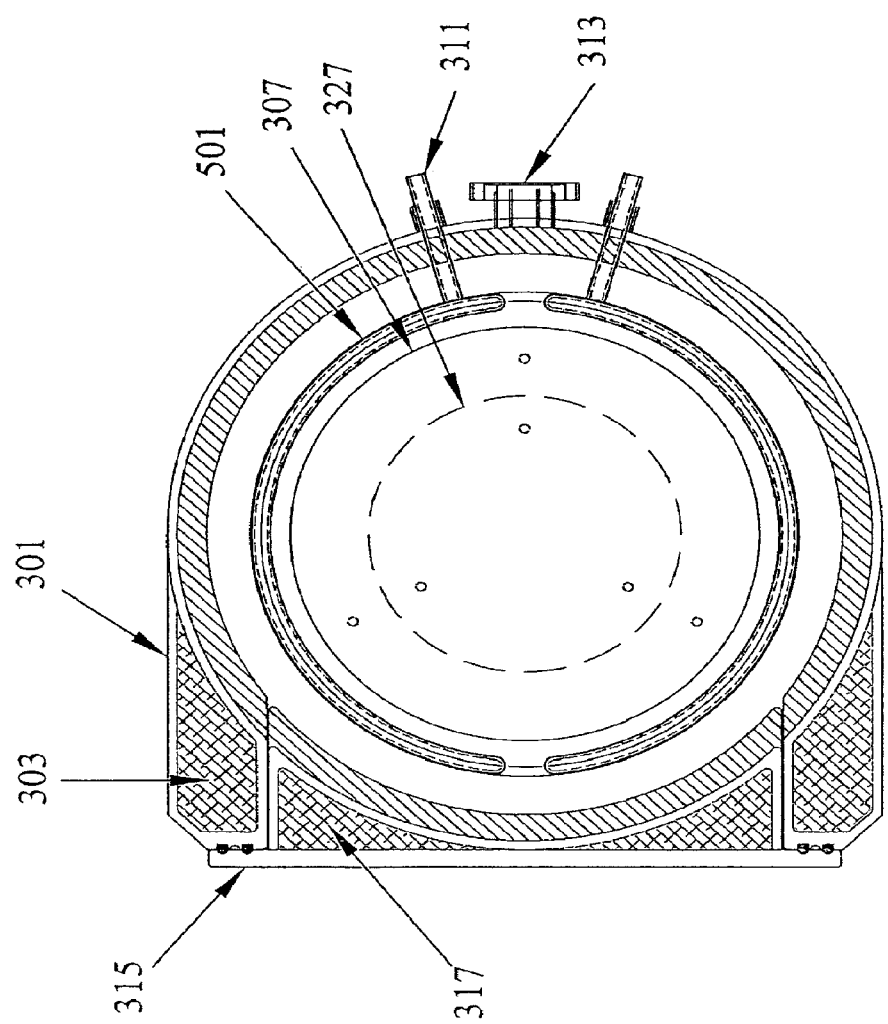
FIG. 5 is a diagram of a top view cut-away of the vacuum thermal annealing system chamber.

FIG. 5 shows a top view of the process chamber 301 and the concentricity of various components contained therein. A substrate injector system 501 is shown in relationship to the substrate 317. The process chamber 301 with the chamber liner 303 is shown in a cut-away view. The substrate holder 307 is shown with the substrate 327 in the processing position. The chamber door 315 and the chamber door liner 317 are shown in a cut-away view representing a relationship of the substrate 317 to the chamber door 315 in a closed position.

Figure 6:
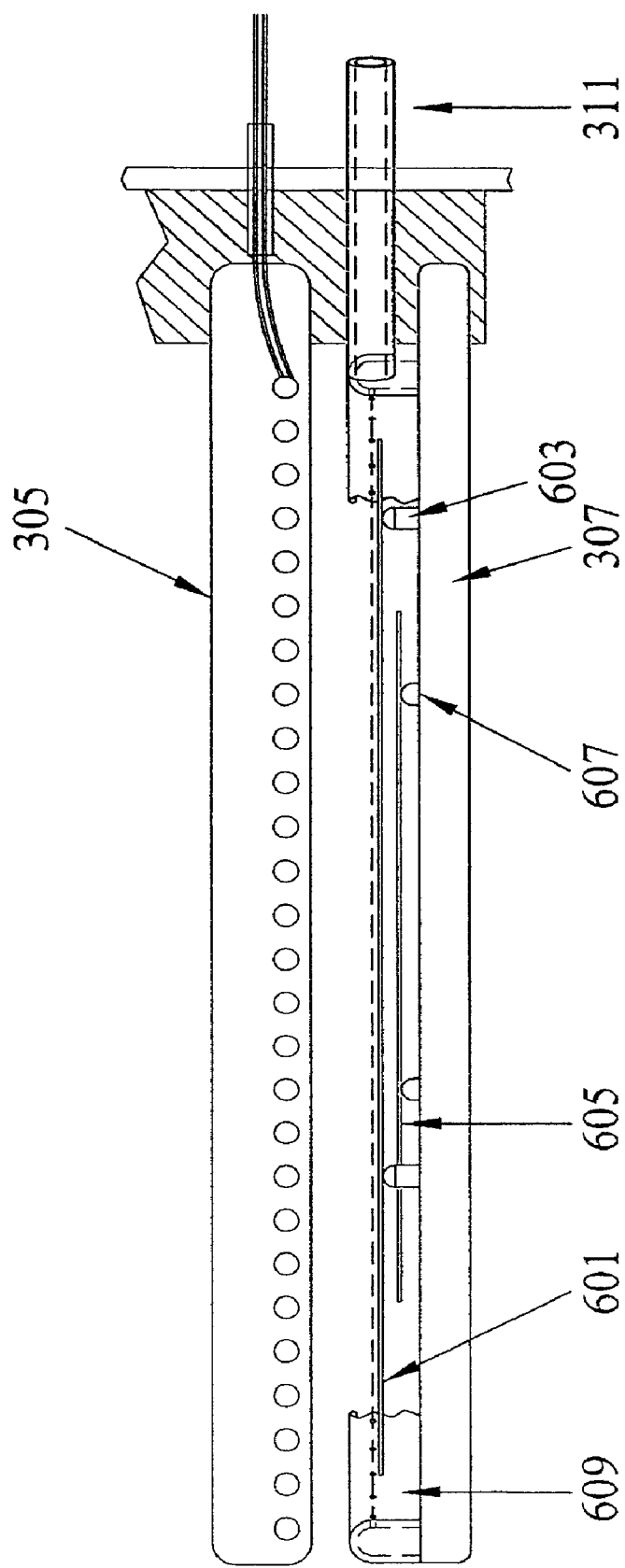
FIG. 6 is a diagram illustrating the details of the mantle and injector components of the vacuum thermal annealing system.

FIG. 6 is a cut-away, exploded view of the substrate holder 307 and the heater system 305. A large substrate 601 (e.g., a 300 mm diameter wafer) is shown resting in position on associated large substrate pedestals 603, which may be, for example, 9 mm high. A smaller substrate 605 (e.g., a 200 mm diameter wafer) is shown resting on associated small substrate pedestals 607, which may be, for example, 6 mm high. FIG. 6, illustrates that the substrate holder 307 is able to accommodate two substrate diameters or sizes. Typically, two substrate sizes will not be loaded simultaneously. Provisions may be a made to hold additional substrate sizes in similar ways with additional pedestals.

FIG. 6 further shows that a part of the injector system 311 rises above the large substrate 601 such that gas flow from orifices in the injector system 311 will flow planar to and across the top surface of the large substrate 601. Additionally, FIG. 6 illustrates that the injector system 311 rises above the large substrate 601 such that it will shield or deflect heated gases that are rising in a heat plume from within the process chamber 301. Shielding of the large substrate 601 by the injector system 311 portion isolates any substrate from the heat plume.

The substrate holder 307 includes a plurality of small substrate pedestals 607 and large substrate pedestals 603 that are used to support the small and large substrates 605, 601 during the annealing process, and separate substrates from a surface of the substrate holder 307. There may be additional or other pedestals of different heights in relationship to a surface of the substrate holder 307, and positioned such that more than one substrate diameter may be processed within the vacuum thermal annealing system 300. The small and large substrate pedestals 607, 603 are typically constructed of the same material as the substrate holder 307 and are rounded at a contact point with the substrate 605, 601 to minimize substrate contact. The design of the small and large substrate pedestals 607, 603 minimize thermal conductance between the substrate 605, 601 and the substrate holder 307 and allows sweeping gases to flow under and around all surfaces of the substrate 605, 601.

Any substrates 327, 605, 601 that are loaded into the process chamber 301 are heated by the heater system 305 and by a superheated gas supplied by a gas heater, which well be discussed in more detail with reference with FIG. 9. The heater system 305 heats the substrate 605, 601 to a preset value as is further discussed with reference to FIG. 8 below. Similarly, the gas heating system of FIG. 9 heats incoming gas to a desired value so that gas enters the process chamber 301 preheated as is further discussed with reference to FIG. 8 below. The heated gas may be injected with the special injector system 311 such that the gas flows planar to and around the surface of the substrate 605, 601. A plurality of orifices 609 in the injector system 311 are directed toward the substrate 605, 601. The orifices 609 are typically sized such that there is an aspect ratio of between 4:1 and 10:1 as compared with a distance between an injector wall and the substrate 605, 601 and the diameter of the orifice 609. The orifices 609 are typically bored with a laser, which produces a smooth wall on the orifice 609. The smooth wall maintains proper gas flow characteristics such that, at a given delivery pressure, each orifice 609 will flow a similar amount of gas. Typically, an inert gas, a forming gas, and/or a hydrogen gas are used, for example, because these gases are allowed to flow directly over any semiconductor device to remove oxidizers and to act as reducing agents that affect the desired properties of the semiconductor device.

Figure 7:
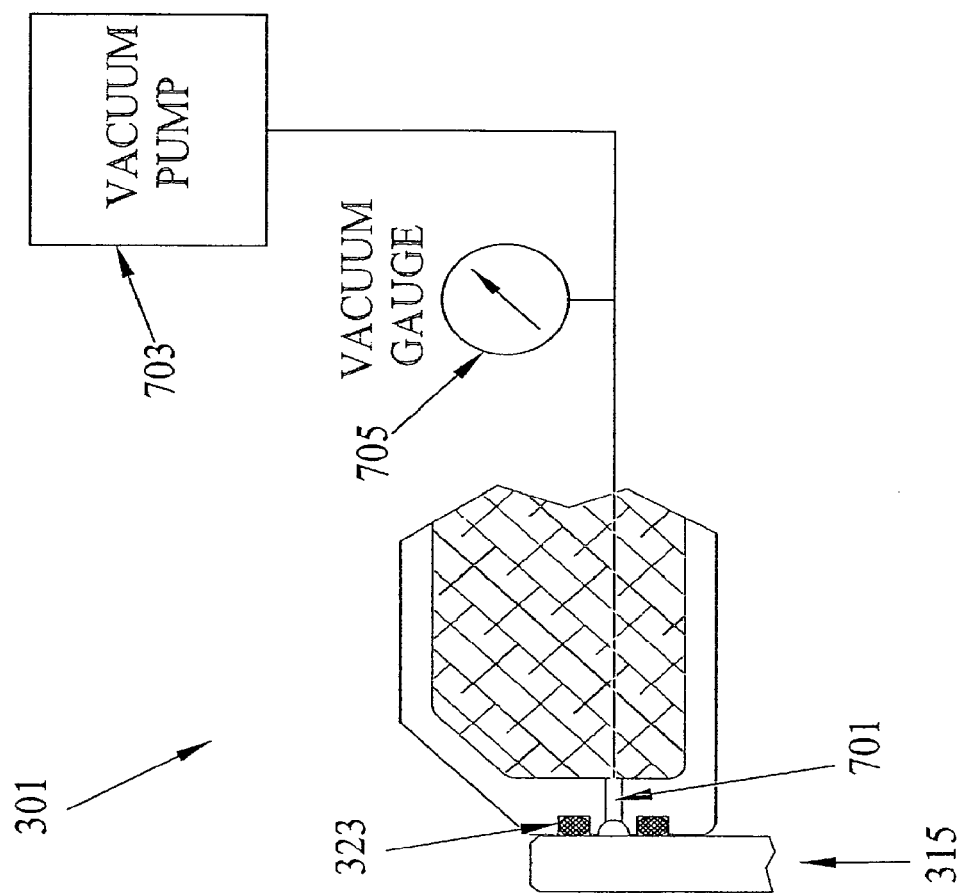
FIG. 7 is a diagram illustrating the door interlock of the vacuum thermal annealing system.

FIG. 7 illustrates an exemplary cut-away view of the process chamber 301, showing a chamber door 315 and o-rings 323. Between the set of o-rings 323 is a groove that is used as a vacuum reservoir 701 to monitor the pressure or vacuum between the o-rings 323. A vacuum pump 703 and vacuum gauge 705 are connected to the vacuum reservoir 701. When the process chamber 301 is under vacuum or elevated to a level above atmospheric pressure, a vacuum level in the vacuum reservoir 701 is monitored. If there is a leak in the o-ring 323 seal, the pressure rises within the vacuum reservoir 701 and is then monitored by the vacuum gauge 705. The level of the vacuum gauge 705 is monitored such that if there is a leak in the seal, an interlock signal, preferably a digital signal, is sent to a controller, which then reacts to maintain a safe condition within the vacuum thermal annealing system 300.

Figure 8:
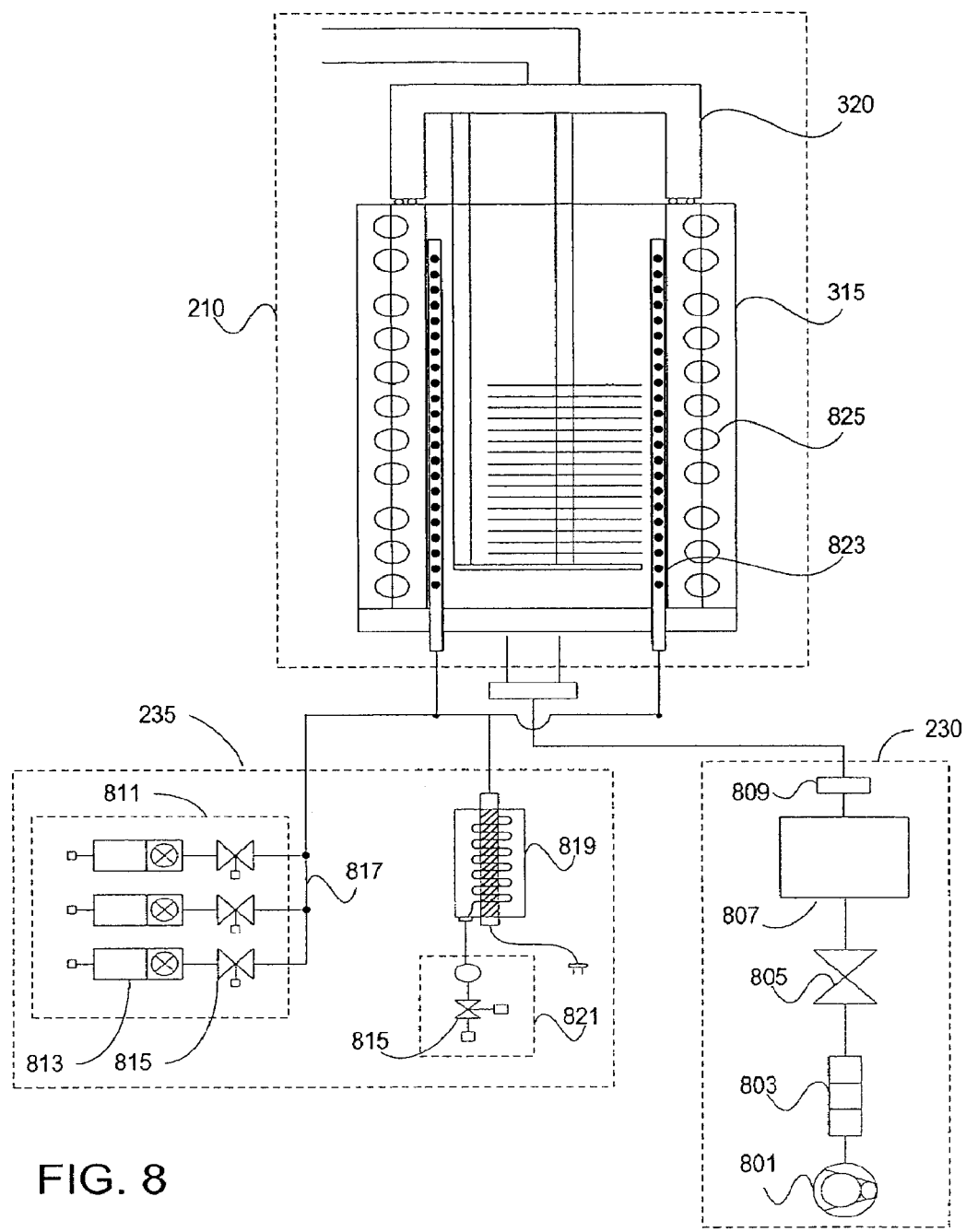
FIG. 8 is a diagram illustrating a pumping system and a gas delivery system of the vacuum thermal annealing furnace of FIG. 3.

FIG. 8 is a diagram illustrating details of the exemplary pumping system 230 and the exemplary gas distribution system 235 coupled to the process chamber 210 (FIG. 2). The exemplary pumping system 230 includes a roughing pump 801, a turbomolecular pump 803, pump valves 805, a vacuum filter 807 and vacuum gauges 809. The roughing pump 801 is used as a backing pump for the turbomolecular pump 803, and can evacuate the process chamber 210 to pressures of approximately 3 torr. The turbomolecular pump 803 is a drag type pump, which is backed by the roughing pump 801, and can evacuate process chamber 210 to pressures lower than $10^{-5}$ torr, depending on conditions such as pumping time, temperature, moisture, and out-gassing of different materials in the process chamber 210. The pump valves 805 are standard valves used to isolate selected parts of the pumping line, and can be driven electrically, pneumatically, or manually. Furthermore, the pump-valves 805 can also be used for soft rough pumping and soft venting techniques which reduce the number of particles in the process chamber 210. Both soft roughing a soft venting can be accomplished by slowly opening a valve as a function of chamber pressure so that pumping is done slowly and uniformly. The vacuum filter 807, which can be as simple as a wire mesh or as complex as a chemically reactive filter, is used to keep the process chamber 210 free of particulates and contaminants originating in the pumping system 230, and to keep the turbomolecular pump 803 and the roughing pump 801 clean.

The exemplary gas distribution system 235 may only include a gas pressure regulator, or may include a mass flow assembly 811 having mass flow controllers 813, flow valves 815, a mixing manifold 817, a gas heater 819, a gas pressure and flow regulating system 821, and a gas distribution manifold 823. The gas distribution manifold 823 may be externally heated to maintain the temperature of the heated gas within the manifold.

Each mass flow controller 813 controls and regulates an amount of mass of a gas that is allowed to pass through the mass flow controller 813 to the process chamber 210. Typically, the mass flow controller 813 measures the mass of gas flowing through the mass flow controller 813 using well established techniques such as heat capacity measurements. Consequently, the mass flow controller 813 controls the gas flow with the use of an internal valve (not shown) located within the mass flow controller 813. Gas flow is increased and decreased by respectively opening and closing the internal valve located within the mass flow controller 813. By attaching several mass flow controllers 813 in parallel as shown in FIG. 8, different gasses can be mixed very precisely (in the mixing manifold 817) since the flow of each gas can be precisely controlled.

Further, substrates can be doped with different elements of compounds by mixing a correct ratio of gases, and injecting the gas mixture into the processing chamber 210. The doping rate and uniformity can further be controlled by adjusting a temperature of the substrate. Since the vacuum thermal annealing furnace 200 can precisely control two processing parameters, gas ratio and temperature, the vacuum thermal annealing furnace 200 (FIG. 2) is suitable for doping wafers as well as annealing substrates.

Substrates are annealed by gases from the gas heater 819. Initially, the gas pressure and flow regulating system 821, which includes conventional valves and pressure regulators, controls the amount of gas which flows into the gas heater 819. The heated gas flows to the gas distribution manifold 823 comprised of a tube with small holes, designed to deliver the gas uniformly across all of the substrates in the process chamber 210. In a one embodiment, special injectors may be used to inject the heated gas planar to the surface of the substrates. In order to achieve uniform gas flow across the substrates, the holes can be made of different sizes to compensate for pressure drops across the tube. The uniform gas flow across the substrate results in uniform substrate heating. It should be noted that the gas heater 819 and chamber wall heater 825 are typically electrical resistive heaters, but may be inductive heaters or some other type of heater known to one skilled in the art, which are further discussed with reference to FIG. 9.

Figure 9:
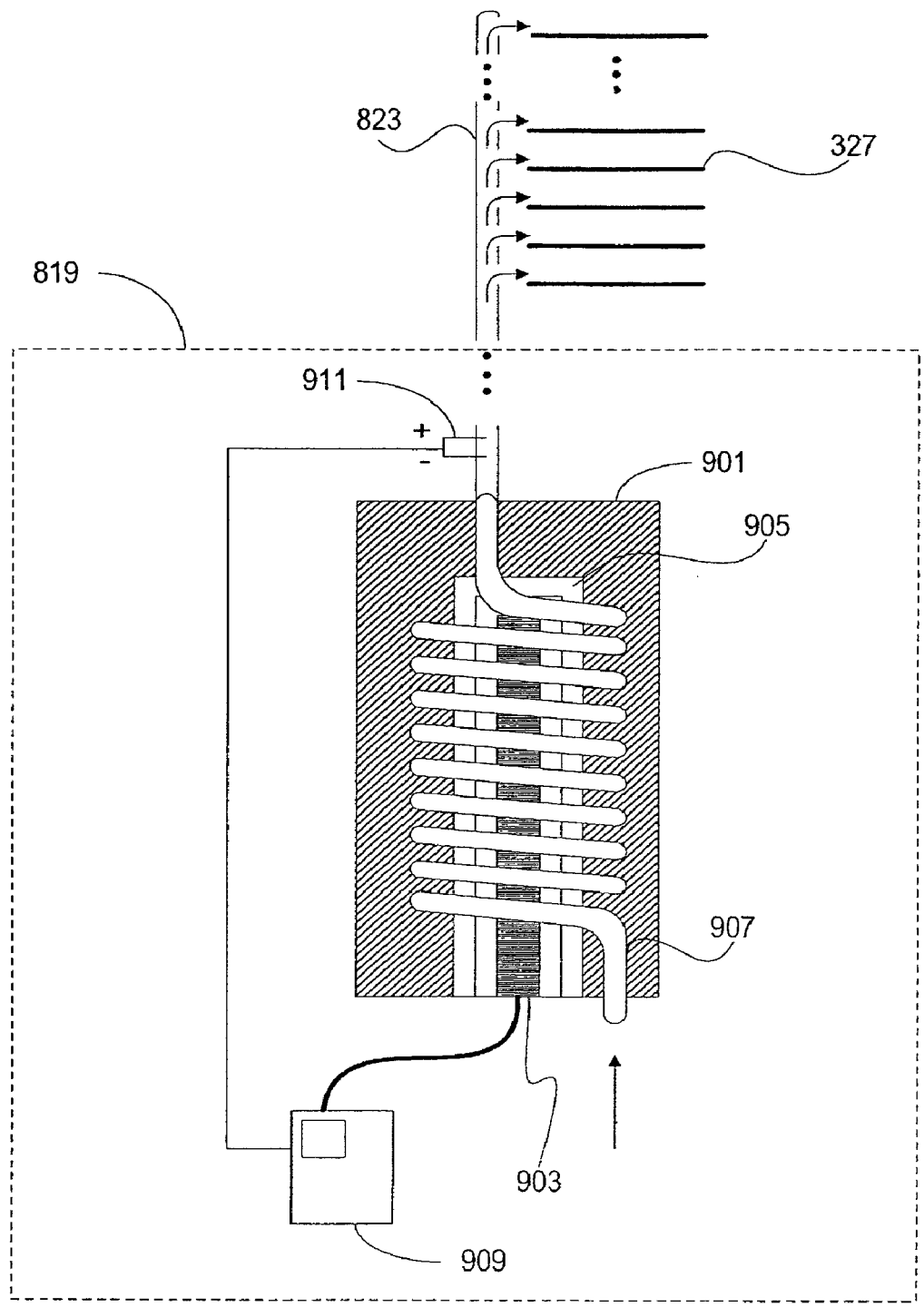
FIG. 9 is a diagram illustrating details of a heating unit.

FIG. 9 is a diagram illustrating details of the exemplary gas heater 819 of FIG. 8. Typically, the gas heater 819 is electrically resistive, and includes a heater housing 901, a resistive heating element 903, an electrical insulation mechanism 905, a gas pipe 907, a controller/power supply 909, and a thermocouple 911. Typically, the heater housing 901 is a stainless steel cylindrical canister, but can be made of alternative materials, and can be of any shape necessary.

The gas heater 819 is usually constructed by wrapping a gas pipe 907 around the resistive heating element 903, typically a Tungsten rod. Alternatively, the resistive heating element 903 can be any material of sufficient electrical resistance to generate appropriate heat when current is passed through the resistive heating element 903. The gas pipe 907 is usually a thin wall metal tube such as electro-polished stainless steel tubing, but may also be made out of any conventional piping material which is suitable for this application. The gas piping may also be made from the same ceramic material as the chamber liner 303 (FIG. 3) such as zirconia. Heat output from the resistive heating element 903 is controlled by an amount of current sent through the resistive heating element 903. The gas pipe 907 is electrically isolated by the electrical insulation mechanism 905, typically made of mica. Further, the gas pipe 907 is thermally coupled to the heating element 903 so that the gas heater 819 can operate efficiently. This thermal coupling is usually achieved by a sturdy mechanical connection between the gas pipe 907 and the heating element 903.

The temperature of the gas exiting the gas heater 819 is measured by the thermocouple 911. The thermocouple 911 is a standard thermocouple which is chosen according to a specific application (for example, K thermocouples are the most popular and have the widest temperature range, J thermocouples offer ruggedness and reliability, and T thermocouples have the narrowest range but are ideal for very precise temperature measurements under 200° F.). The thermocouple 911 is typically positioned in a gas line after the gas heater 819. However, the position of the thermocouple 911 can be anywhere in the process chamber 210 (FIG. 2), and is chosen so that the best temperature control of the substrates is achieved for a specific application or process.

The temperature of the gas is controlled by a feedback loop involving the thermocouple 911, the controller/power supply 909, and the resistive heating element 903. The thermocouple 911 measures the temperature of the gas and outputs temperature data to the controller/power supply 909 which may be a standard temperature controller coupled to a standard power supply. The power supply may be voltage or current regulated. The controller/power supply 909 uses these temperature data to calculate the amount of power needed to reach and/or maintain a predetermined temperature set-point. Further, the controller/power supply 909 delivers appropriate power for temperature control by adjusting output voltage and/or current to the resistive heating element 903. Control/power supply 909 typically uses a PID (proportional-integral-derivative) algorithm to calculate and adjust an output power. Alternatively, other types of system control algorithms may be utilized. The temperature control algorithm is further discussed in conjunction with FIGS. 11A and 11B below.

The gas heater 819 usually uses inert gases, such as Argon, as a heating gas but other reactive gases may be used. Inert gases are preferred because reactive gases, when heated, may react with the gas pipe 907 causing damage to the system. However, if a process requires heated reactive gases to be injected into the process chamber 210, the present embodiment is equipped to handle reactive gases. The primary function of the gas heater 819 is to assist in achieving good temperature uniformity across a substrate during the annealing or other process, and to rapidly heat the process chamber 210 and substrate to the temperature set-point.

Simultaneously with the flow of heated gas, the chamber wall heater 825 (FIG. 8) temperature is reduced. The chamber wall heater 825, as is further discussed below, is typically used to maintain the temperature of the substrates and process chamber 210 or 301 at a high temperature set-point but can also be used to do the majority of the heating, if desired. Like the gas heater 819, the chamber wall heater 825 may be an electrical resistive heater which heats up the process chamber 210 by sending current through electrically resistive elements. The chamber wall heater 825 is thermally coupled to the chamber wall, usually by a direct mechanical connection. A heat output from the chamber wall heater 825 is controlled by adjusting power based on data from the thermocouple 911. The chamber wall heater 825 also uses a control scheme such as a PID algorithm to control its power output. Once the chamber wall heater 825 is thermally stable, the heated gas flow is reduced and heat from the chamber wall heater 825 maintains a constant temperature for an appropriate amount of time.

Figure 10:
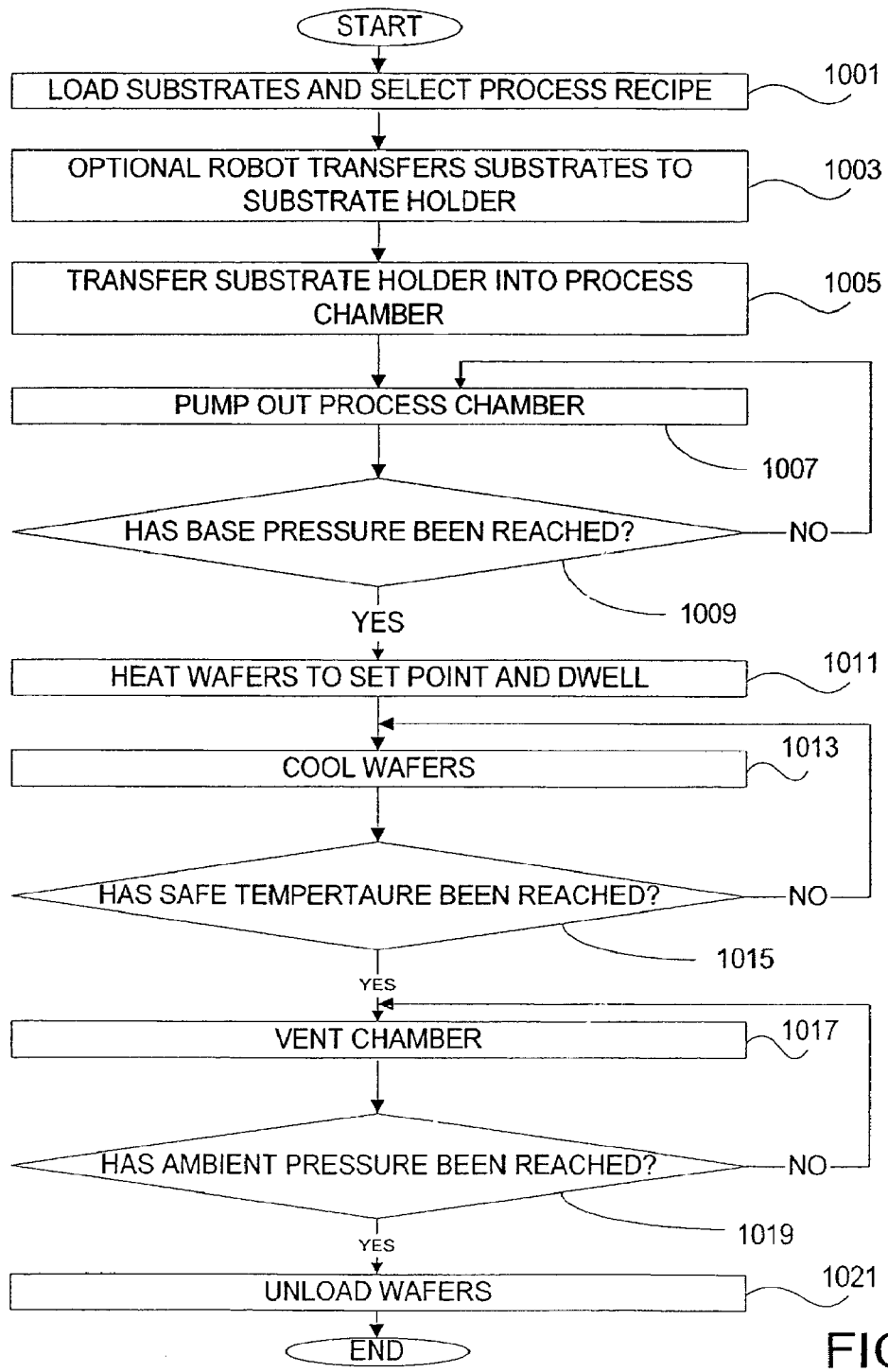
FIG. 10 is a flowchart of a procedure for loading and processing of a substrate.

FIG. 10 is a flowchart illustrating an exemplary method for loading and processing one or more substrates in the vacuum thermal annealing furnace 200 (FIG. 2). In step 1001, the substrates are loaded into the vacuum thermal annealing furnace 200, and a process recipe is selected. The substrates can be loaded by positioning the substrates in their cassettes so that the optional robot 225 (FIG. 2) can load the substrates into the substrate holder 215 (FIG. 2). Alternatively, the substrates can be manually loaded onto the pedestals 607, 603 (FIG. 6) of the substrate holder 215. The process recipe usually includes a temperature ramp-up rate, a temperature set-point, a dwell time, a temperature ramp-down rate, and a selection of which mass flow controllers 813 (FIG. 8) is used. The process recipe is selected from a plurality of recipes on the control system 240. Alternatively, a user may enter a custom recipe into the control system 240. Next in step 1003, the substrates are transferred into the substrates holder 215 by the optional robot (if used). Step 1003 is skipped if the substrates are manually loaded into the substrate holder 215 in step 1001.

Once the substrate holder 215 has been moved into the process chamber 210 in step 1005 and the set of o-rings 323 forms a seal, a vacuum is created in the process chamber 210 in step 1007. The vacuum drawn on the process chamber 210 removes both air and outgassed residual materials. Pressure in the process chamber 210 is monitored by the vacuum gauges 809 (FIG. 8). In step 1009, a decision is made as to whether the process chamber 210 has reached a sufficient vacuum level. If the desired vacuum level has been reached, then heated gas is injected into the process chamber 210 planar to the substrate. If the vacuum thermal annealing furnace 200 is only used to anneal substrates, heated gas is allowed to flow into the process chamber 210 through the gas heater 819 (FIG. 8). Alternatively, if the vacuum thermal annealing furnace 200 is used to dope substrates 819 then gas is allowed to flow through the mass flow assembly 811 (FIG. 8) and mixing manifold 817 (FIG. 8). During this gas flow process, pressure in the process chamber 210 is quickly raised by closing the vacuum valve 815 (FIG. 8). The pressure in the process chamber 210 is maintained by the programmable exhaust valve 325 (FIG. 3), which is controlled by the software of the control system 240 (FIG. 2). A typical processing pressure for the annealing process is 69 kPa (approximately 10 psia). A regulating transducer (not shown) is used through which the heated gas exhausts and maintains the chamber pressure, thus allowing the heated gas to remain at the surface of the substrate (residence time) to transfer energy from the gas to the substrate. There is a constant supply of heated gas, which replaces the energy that is transferred to the substrate. Furthermore, the chamber wall heater 825 (FIG. 8) will turn on to help maintain an appropriate temperature. Thus, the heated gas quickly applies thermal energy uniformly across the substrate, while the chamber wall heater 825 is used to maintain a constant temperature for the length of the annealing cycle, which may be as long as one hour or more.

The resistive heater coil (not shown) may be replace by an inductive heater that includes a magnetic resonator that is used to produce the thermal energy. The basic premise of the annealing cycle remains the same for any type of chamber wall heater 825.

As the process gas is allowed into the process chamber 210, the substrates are heated to a temperature set-point and allowed to remain at this temperature for a set time in step 1011. The temperature control algorithm is further discussed with reference to FIGS. 11A and 11B below. Once the set-time has elapsed, the substrates are cooled by ramping down the temperature at a controlled predetermined rate in step 1013. The cooling process can be accomplished by flowing cool gas over the chamber wall heater 825, and can be accelerated by equipping the chamber walls with water cooling tubes (not shown) having cold water circulating therein. A controlled cooling is achieved by opening and closing flow valves 815 (FIG. 8) in the mass flow assembly 811 and the gas pressure and flow regulating system 821 (FIG. 8). If rapid cooling is desired, then the flow valve 815 in the mass flow assembly 811 is opened, and the flow valve 815 in gas pressure and flow regulating system 821 is closed allowing only cold gas to flow over the chamber wall heater 825. The chamber wall heater 825 and the substrates in the processing chamber 210 are then both cool rapidly. As the substrates are cooled, the temperature of the chamber wall heater 825 is monitored by the thermocouple(s) 911 (FIG. 9).

In step 1015, a decision is made as to whether the process chamber 210 is cool enough to be opened safely. If a safe temperature has been reached (typically 50° C.), the process chamber 210 is vented in step 1017. The pressure in process chamber 210 is monitored during the venting in step 1017, and when a decision is made in step 1019 that ambient pressure has been reached, the substrates are unloaded in step 1021. The unloading process consists of transferring the substrate holder 215 out of the process chamber 210 with either the optional robot 225 or manually.

FIG. 11 is a flowchart illustrating an exemplary method for temperature control of the heating cycle of step 1011 of FIG. 11. In step 1101, the controller/power supply 909 (FIG. 9) receives and stores in memory the process temperature set-point and process dwell time. Next, in step 1103, the temperature of the process chamber 210 (FIG. 2) is measured using the thermocouple 911 (FIG. 9). These measured temperature data are transferred to the controller/power supply 909 in step 1105. Subsequently, the measured temperature is compared with the set-point temperature in step 1107.

Next, in step 1109, a decision is made as to whether the temperature set-point has been reached. Usually, this decision is made by comparing the measured temperature value with a tolerance range of temperatures centered on the temperature set-point. For example, if the temperature set-point is set at 320° C., the temperature will be considered reached if the measured temperature falls between 319.5° C. and 320.5° C. Once the temperature set-point has been reached, another check is performed in step 1111 to determine if a timer has been started. If the timer has not been started in step 1111 then the timer is started in step 1113. Alternatively, if the timer has been started then the timer is allowed to continue running in step 1115. If the temperature set-point had not been reached in step 1109 then, in step 1117, another check is performed to determine if the timer had been previously started. If it is determined in step 1117 that the timer had been previously started and the temperature had not been reached, then the user is notified of a temperature control problem by an alarm in step 1119.

As the timer continues to keep track of elapsed time, another check is performed in step 1121 to determine if the timer has been running for longer than the dwell time. If it is determined in step 2212 that the timer time has exceeded the dwell time, then the heating/dwelling cycle is completed, and the process is completed in step 1011 (FIG. 10). Otherwise, in step 1123, the controller/power supply 909 calculates an amount of power output to send to the heaters to achieve or maintain the set-point temperature. This power output calculation is typically performed by a PID algorithm that uses the measured temperature data and the set-point data to calculate the amount of power required so that the desired temperature set-point is reached quickly, and is stable during the entire process. Once the power output is calculated, the controller/power supply 909 sends the correct power to the heaters in step 1125. This process is then repeatedly continued until the time on the timer has exceeded the dwell time in step 1121, or until an alarm is sounded, as in step 1119.

Figure 11A:
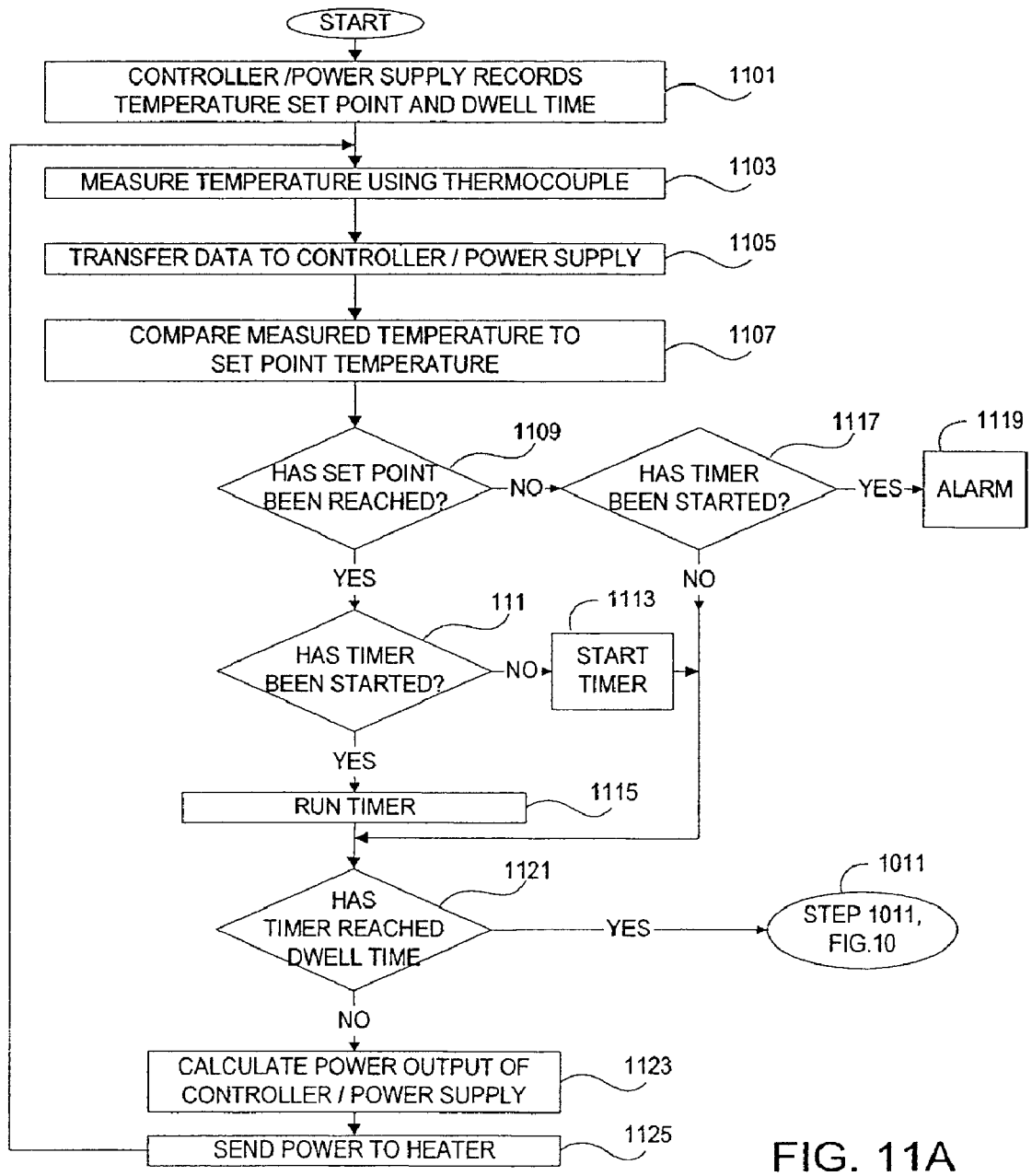
FIG. 11A is a flowchart showing steps for temperature control during the heating cycle in step 1011 in FIG. 10.
Figure 11B:
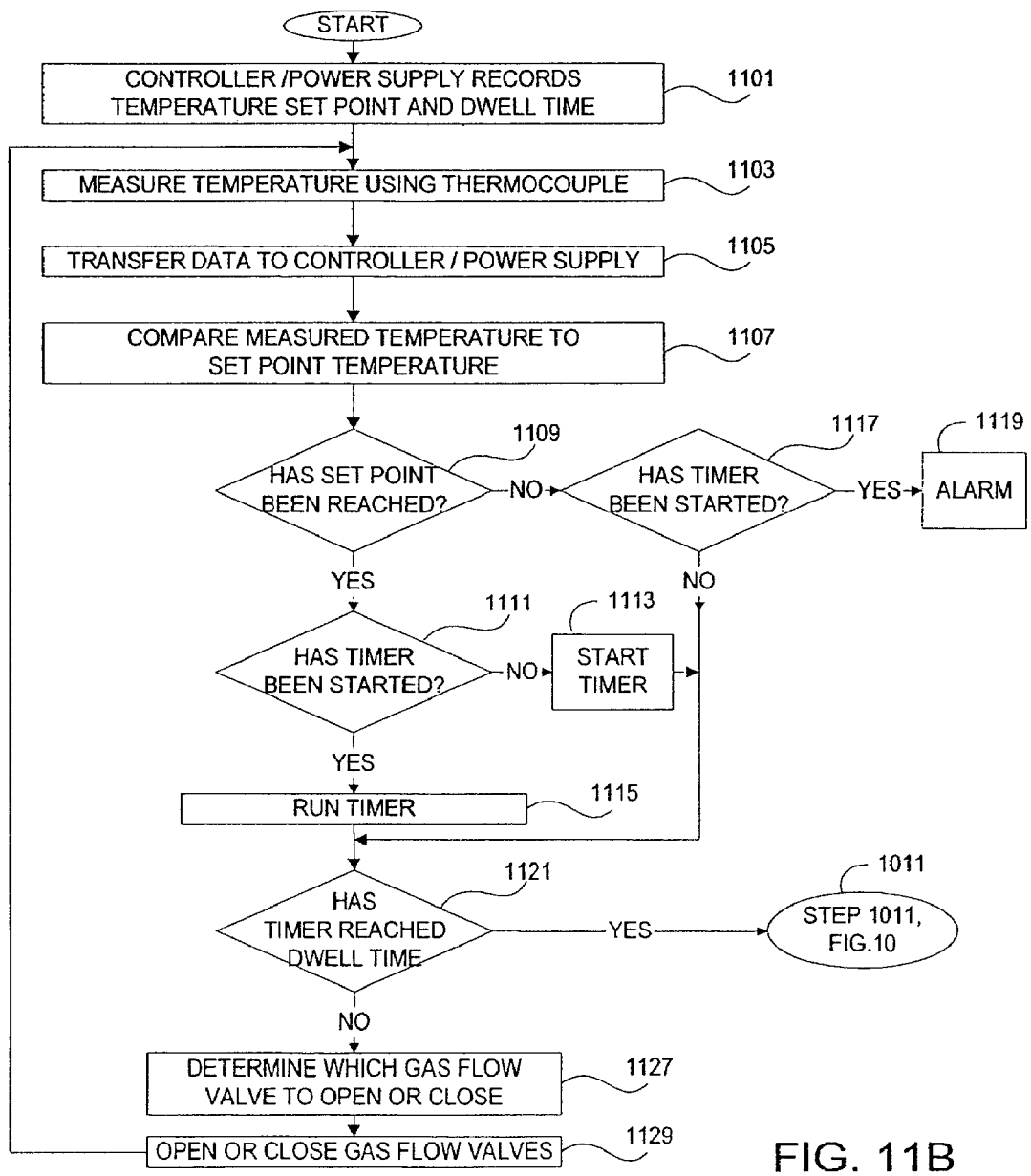
FIG. 11B is a flowchart showing steps for temperature control during the heating cycle in step 1011 in FIG. 10, which uses a cold and hot gas mixing technique.

FIG. 11B is a flowchart illustrating an alternative method for temperature control of the heating cycle of step 1011 of FIG. 10. In this alternative embodiment the set-point temperature can be maintained by keeping the power output of the gas heater 819 (FIG. 8) fixed and adjusting the final temperature of the gas flowing into process chamber 210 by controlling a mixture of cold gas and heated gas. Cold gas refers to gas that is at a lower temperature than the heated gas. Cold gas flows through mass flow assembly 811 (FIG. 8), which contains the flow valves 815 (FIG. 8), whereas heated gas flows through gas heater 819 and gas pressure flow regulating system 821 (FIG. 8) that also contains the flow valves 815. Opening and closing the flow valves 815 mix the hot and cold gases. For example, closing the appropriate flow valves 815 in the mass flow assembly 811 and opening the appropriate flow valves 815 in the gas pressure and flow regulating system 821 increases the temperature, whereas opening the appropriate flow valves 815 in the mass flow assembly 811 and closing the appropriate flow valves in the gas pressure and flow regulating system 821 decreases the temperature.

In this alternative method, steps 1101 through steps 1121 are the same as previously discussed with reference to FIG. 11A. In step 1127, the states (opened or closed) of flow valves 815 in the mass flow assembly 811 and the flow valves 815 in the gas pressure and flow regulating system 821 are determined. A similar PID algorithm, as was discussed with reference to step 1123 (FIG. 11A), can be used to determine when any of the flow valves 815 should be opened or closed and an amount, if any, any of the flow values 815 should be opened. In step 1129, signals to open or close each of the flow valves 815 are transmitted from the controller/power supply 909 (FIG. 9) to the flow valves 815. For electrical valves, the transmitted signals for opening or closing the flow valves 815 are typically 12 VDC signals or 120 VAC signal. If pneumatic valves are used, then 5 VDC signals are typically used to actuate another valve that allows pressurized gas to open or close the flow valves 815. This alternative embodiment can have a simpler power supply than the previous embodiment of FIG. 11A because the power supply can be a set of relays, rather than a voltage of current controlled power supply used in the embodiment of FIG. 11A.

Figure 12:
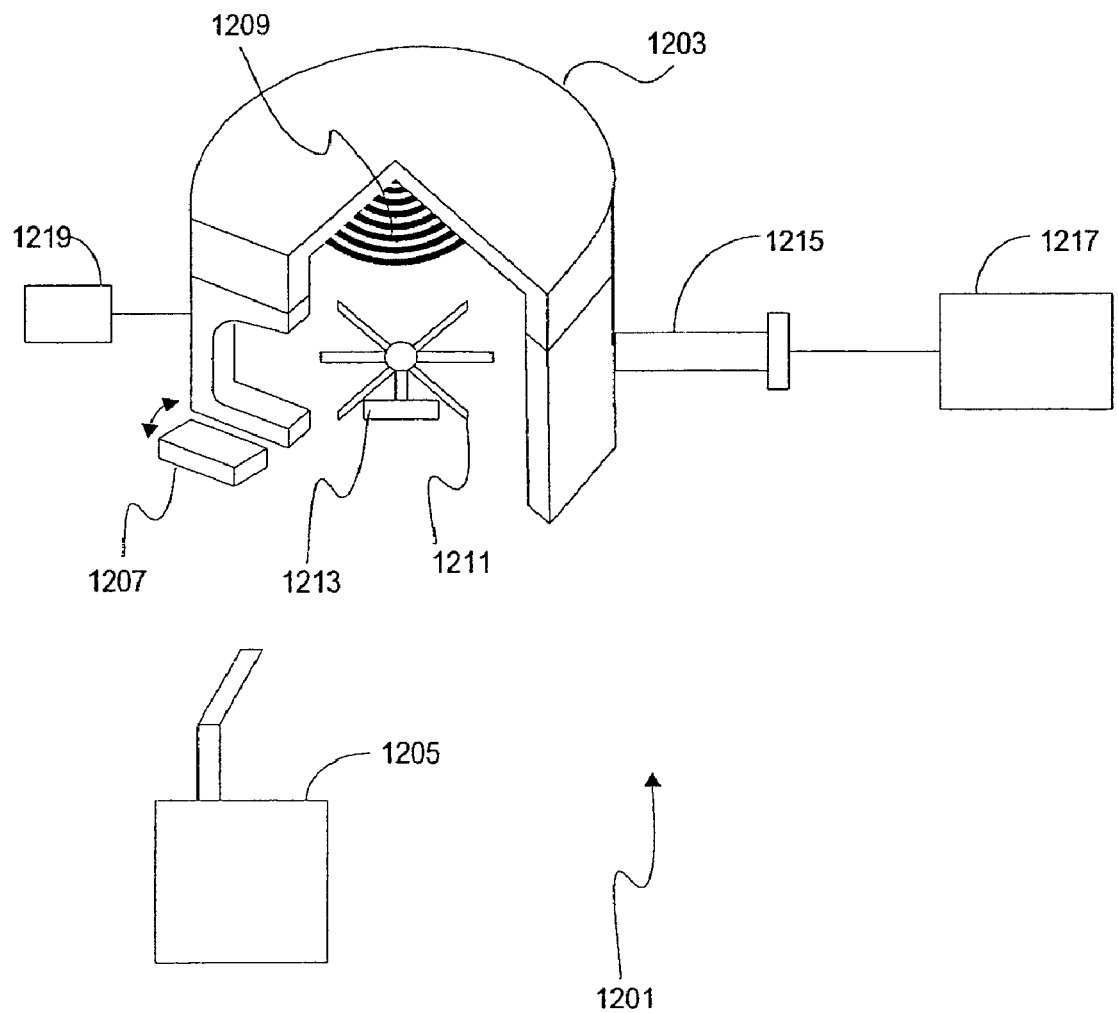
FIG. 12 a diagram illustrating an alternative embodiment of the vacuum thermal annealing furnace having single substrate processing capabilities.

FIG. 12 is a diagram showing a cut-away side view of an alternative embodiment of a vacuum thermal annealing furnace 1201 in a ready-to-be-loaded position. The vacuum thermal annealing furnace 1201 includes a process chamber

1203, an optional robot 1205, a chamber door 1207, a heating element 1209, a rotating substrate holder 1211, a rotating shaft and motor assembly 1213, a vacuum pipe and flange 1215, a pumping system 1217, and a gas heating system 1219.

The process chamber 1203 is a vacuum chamber typically made of stainless steel or aluminum that can hold one substrate but which can be coupled together with other identical process chambers 1203 creating one tool capable of processing multiple substrates as further described with reference to FIG. 13. The inside of the process chamber 1203 can also be lined with a liner, usually made out of a metal or ceramic such as zirconium. The purpose of the liner is to make the process chamber 1203 easier to maintain as well as improve the heating characteristics of the process chamber 1203. The optional robot 1205 is a standard robot, as described earlier in FIG. 2, and is used to transfer substrates between the process chamber 1203 and, for example, a substrate cassette holder (not shown). Heating element 1209 is typically a resistive heating element made out of high resistance material such as Tungsten and is heated by running current through it. The rotating substrate holder 1211 supports the substrates during processing and is coupled to the rotating shaft and motor assembly 1213. Additionally, the rotating substrate holder 1211 is constructed from materials with favorable heat transfer properties, such as aluminum or zirconium. The rotating shaft and motor assembly 1213 is typically an electrically or pneumatically powered motor that drives a shaft (usually metallic) mounted to a motor.

This alternative embodiment of vacuum thermal annealing furnace 1201 begins the annealing process by loading a substrate into the process chamber 1203, either manually or with the optional robot 1205. After the single substrate is loaded onto the rotating substrate holder 1211, the chamber door 1207 is closed forming a vacuum type processing chamber. The chamber door 1207, typically made of stainless steel or aluminum, is hinged to a wall of the process chamber 1203, and has an o-ring grove that supports an o-ring. A vacuum seal is created when the chamber door 1207 is closed and the o-ring makes contact with an exterior portion of a wall of the process chamber 1203. The pumping system 1217 then evacuated the process chamber 1203 by pumping gas through the vacuum pipe and flange 1215. Subsequently, the rotating shaft and motor assembly 1213 rotates the rotating substrate holder 1211 as the heating element 1209 heats the substrate. The gas heating system 1219 assists in the heating process by preheating the gas within the gas heating system 1219, and injecting that preheated gas into the process chamber 1203 as previously described in more detail in the embodiment of FIG. 8.

The substrate heating system of this alternative embodiment is slightly different than the substrate heating system used in the first embodiment described in FIG. 8. The alternative heating system includes the heating element 1209, which is typically a resistance heating element wound in, for example, a spiral shape coil located directly above the substrate. The heating element 1209 heats the substrate by both radiating heat down on to the substrate and also through heat convention and conduction, if enough exchange gas is present. Heating uniformity across a substrate in an angular direction is achieved by rotating the substrate with the rotating shaft and motor assembly 1213. Radial heating uniformity across the substrate is further achieved by the spiral design of the resistive heating element 1209. However, it should be noted that other designs for the heating element 1209 may be used to achieve uniform heating across a substrate. This alternative heating system uses the same temperature control algorithm and method of supplying power to the heater as that of the first embodiment discussed with reference to FIGS. 10, 11A, and 11B. The pumping system 1217 and method are also the same as that discussed in the first embodiment.

Figure 13:
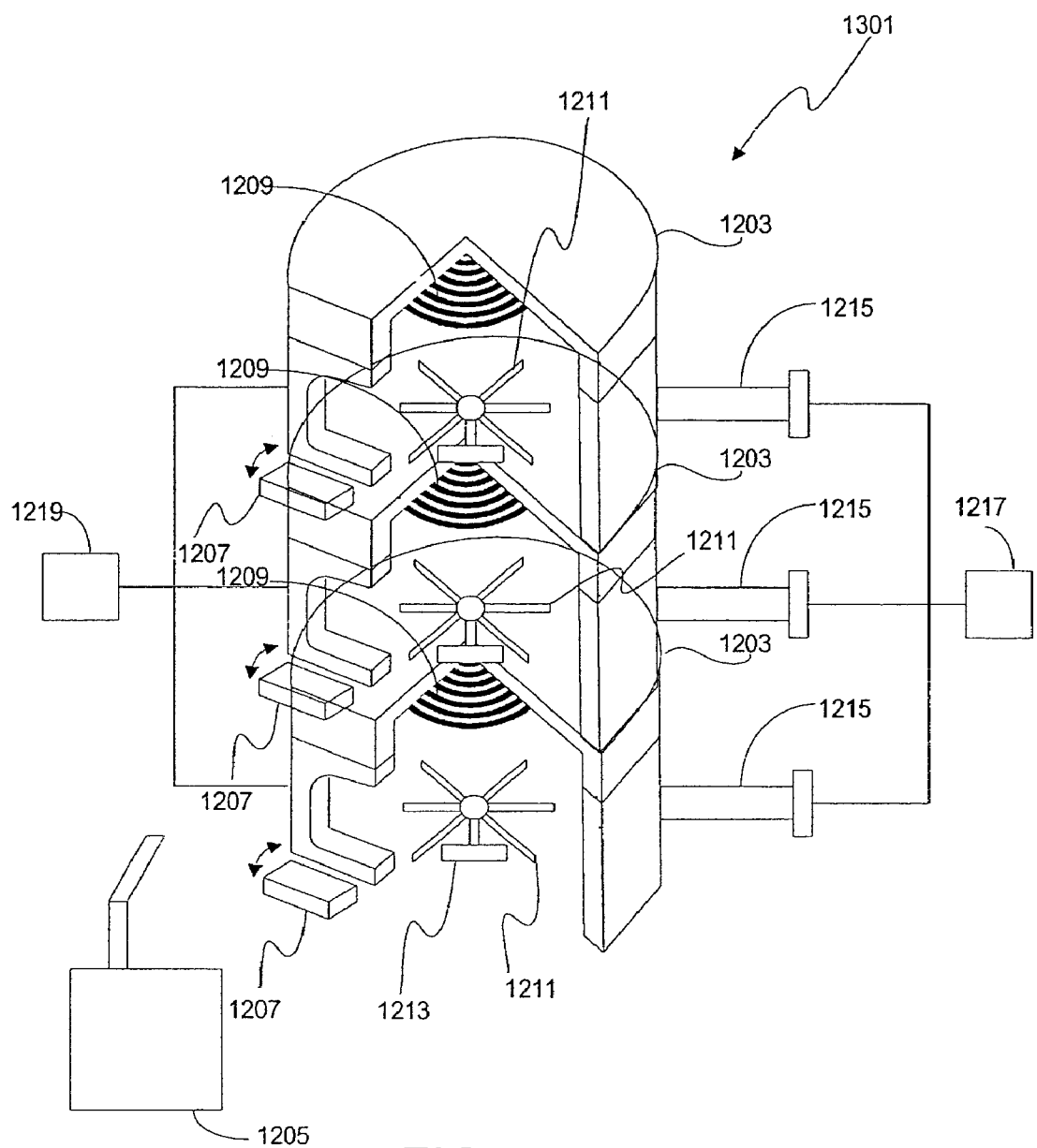
FIG. 13 is a diagram illustrating a plurality of vacuum thermal annealers of FIG. 9 coupled together.

FIG. 13 is a diagram showing several vacuum thermal annealing furnaces 1201 (FIG. 12) coupled together to form a single vacuum thermal annealing system 1301 having several processing chambers 1203, a single pumping system 1217, a single gas heating system 1219, and a single optional robot 1205. The components of FIG. 13 were all discussed in detail with reference to FIG. 12.

The single substrate vacuum thermal annealing furnace 1201 discussed with reference to FIG. 12 can be coupled together by stacking them on top of each as shown in FIG. 13. The advantages of such a design are that all of the individual vacuum thermal annealing furnaces 1201 are supported by the single optional robot 1205, the single pumping station 1217, and the single gas heating system 1219, making the vacuum thermal annealing system 1301 very cost effective. Additionally, the vacuum thermal annealing system 1301 allows for easy scalability by either adding or removing processing chambers 1203 depending on the needs of a business. This vacuum thermal annealing system 1301 also affords the versatility of running different processes in different process chambers 1203 concurrently because each process chamber 1203 is sufficiently isolated from the other process chambers 1203. Substrates can also undergo consecutive processes by running one process in a first process chamber, transferring the substrates to a second process chamber 1203, and running another process. Consecutive processing is advantageous in situations where annealing and doping are preferably done in separate chambers due to problems such as cross-contamination.

Although this alternative embodiment of the vacuum thermal annealing system 1301 can process a plurality of substrates as does the vacuum thermal annealing furnace 200 (FIG. 2) of the first embodiment, there are advantages and disadvantages to using this alternative embodiment of FIG. 13. An advantage of this alternative embodiment is that each substrate can be processed individually in separate processing chambers 1203, whereas in the first embodiment all substrates must be processed in one process chamber 1203. Another advantage of this alternative embodiment is that in the event of a heater malfunction, only one substrate is lost. Conversely multiple substrates could be lost during a heater malfunction in the first embodiment. The disadvantages of this alternative embodiment, however, are that this alternative embodiment is slower and less efficient since the substrates are not processed in batches.

In addition to annealing substrates, the vacuum thermal annealing furnace 200 (FIG. 2) can also be used to dope semiconductor devices on substrates with small amounts of elements or compounds. Doping is accomplished by introducing a doping element, in gaseous form, to the substrate through a gas distribution system such as the system described in FIG. 8. To dope substrates, the temperature of the vacuum thermal annealer 200 is elevated to as high as 900° C. When used at a high temperature, water cooling channels may be added to the chamber door 315 (FIG. 3) to keep the o-rings 323 (FIG. 3) from degrading.

Furthermore, the vacuum thermal annealer 200 can be used to oxidize semiconductor devices. This is especially true for oxides that are very thin, for example, below 400 Angstroms. In this oxidation process, typically, ultra-high purity oxygen is flowed within the process chamber 301 (FIG. 3) and oxidizes the substrated 605, 601 (FIG. 6). Since the vacuum thermal annealer 200 removes air, moisture, and other unwanted materials, a resulting oxide (e.g., silicon dioxide) may have a more desirable dielectric integrity for use with advanced microcircuits. Additionally, the vacuum thermal annealer 200 can be used to thermally process materials such as borophosphosilicate glass (BPSG), which require reflow after deposition. In yet a further embodiment, the vacuum thermal annealer 200 can be used to thermally process or cure low-k (i.e., low-permittivity) or ultra low-k dielectric materials.

The invention has been described above with reference to specific embodiments. It will be apparent to those skilled in the art that various modifications may be made and other embodiments can be used without departing from the broader scope of the invention. Therefore, these and other variations upon the specific embodiments are intended to be covered by the present invention, and thus are only limited by the scope of the claims when given their broadest, reasonable interpretation.

What is claimed is:

1. A vacuum thermal processing system, comprising:
    a process chamber;
    a gas distribution system and a gas heater system coupled to the process chamber and constructed to provide heated gas to the process chamber;
    a vacuum flange coupled to the process chamber, the vacuum flange designed to be coupled to a pumping system;
    at least one substrate holder contained within the process chamber configured to hold at least one substrate for each of the at least one substrate holder;
    a heater coupled to the process chamber, the heater configured to heat any substrate present on the at least one substrate holder, the heater further configured to heat at least one wall of the process chamber; and
    a gas injector system contained within the process chamber, the gas injector system coupled to the gas distribution system to receive heated gas therefrom and configured in a way so as to flow the heated gas in an essentially planar fashion to a face surface of the substrate so as to uniformly heat the substrate.

2. The vacuum thermal processing system of claim 1, further comprising a means of rotating the substrate holder in a direction parallel to the face surface of the substrate.

3. The vacuum thermal processing system of claim 1, wherein the heater is located in proximity to the substrate.

4. The vacuum thermal processing system of claim 1, wherein a thermal control system is coupled to monitor and maintains a temperature within the process chamber.

* * * * *